United States Patent [19]

Huffman

[11] 4,412,299

[45] Oct. 25, 1983

[54] PHASE JITTER DETECTOR

[75] Inventor: Joseph K. Huffman, Kirkland, Wash.

[73] Assignee: Teltone Corporation, Kirkland, Wash.

[21] Appl. No.: 230,689

[22] Filed: Feb. 2, 1981

[51] Int. Cl.³ .................... G01R 23/12; H04M 1/26; H04M 1/00

[52] U.S. Cl. .................... 364/570; 179/84 VF; 324/78 Z; 364/574; 375/118; 375/120

[58] Field of Search ................ 364/570–574; 179/84 VF, 1 P; 375/118, 120; 324/78 Z, 77 E, 77 R

[56] References Cited

U.S. PATENT DOCUMENTS

| | | | |
|---|---|---|---|
| 3,278,685 | 10/1966 | Harper | 324/77 E |
| 3,537,001 | 10/1970 | Friend | 324/78 |
| 3,699,949 | 10/1972 | O'Hanlon, Jr. et al. | 324/78 Z X |
| 3,902,123 | 8/1975 | Oomen | 179/1 P |
| 3,944,753 | 3/1976 | Procter et al. | 179/84 VF |
| 4,016,370 | 4/1977 | Lauteppitaks et al. | 179/84 VF |
| 4,016,371 | 4/1977 | Hammad | 179/84 VF |
| 4,021,623 | 5/1977 | Sharp | 364/484 |
| 4,045,620 | 8/1977 | Westbrook | 179/84 VF |
| 4,063,031 | 12/1977 | Grunza | 179/1 P |
| 4,112,383 | 9/1978 | Burgert | 375/120 X |
| 4,122,391 | 10/1978 | Harp et al. | 324/78 Z |
| 4,123,704 | 10/1978 | Johnson | 324/78 X |
| 4,137,496 | 1/1979 | Lind | 324/78 X |
| 4,142,177 | 2/1979 | Davis | 179/84 VF |
| 4,145,576 | 3/1979 | Twiss | 179/84 VF |
| 4,151,485 | 4/1979 | La Fratta | 375/120 X |
| 4,236,110 | 11/1980 | Shearer et al. | 324/78 X |
| 4,270,183 | 5/1981 | Robinson et al. | 375/118 X |
| 4,320,515 | 3/1982 | Burton, Jr. | 375/120 X |
| 4,339,823 | 7/1982 | Predina et al. | 375/120 X |

FOREIGN PATENT DOCUMENTS 54-105905  8/1979 Japan ............................ 375/118
631841 11/1978 U.S.S.R. ......................... 324/782

Primary Examiner—Felix D. Gruber
Attorney, Agent, or Firm—Christensen, O'Connor, Johnson & Kindness

[57] ABSTRACT

A phase jitter detector that is ideally suited for use in combination with tone receivers (e.g., tone-to-pulse converters) to provide a speech immune tone detection system or in a measuring instrument to provide a direct measurement of the signal-to-noise ratio (SNR) of a signal is disclosed. In either application, the phase jitter detector can be implemented in either phase locked loop or digital logic form. Regardless of how implemented, the phase jitter detector determines the phase jitter of an incoming signal by first squaring the signal (by passing the incoming signal through a high gain amplifier that limits the signal, for example). After squaring, the phase jitter of the squared signal is determined by: (1) determining the phase deviation of each cycle of the squared signal with respect to the average frequency of the squared signal over a predetermined number of cycles; and (2) combining the phase deviation and the predetermined number of cycles information to determine phase jitter. In tone detection system applications, the phase jitter information is used to control whether or not a tone receiver is to complete a tone conversiono sequence. In SNR measuring applications, the phase jitter information is converted into SNR form and displayed.

40 Claims, 8 Drawing Figures

PHASE JITTER DETECTOR

TECHNICAL AREA

This invention is directed to electronic detector circuits and, more particularly, electronic detector circuits for detecting the stability of a signal.

BACKGROUND OF THE INVENTION

In many environments it is necessary to determine the stability of a signal that may or may not contain information and base certain actions on the results of the determination. For example, contemporary telephone systems frequently include tone receivers for converting DTMF (dual-tone multi-frequency) signals into rotary dial pulse form for use by central offices only equipped to respond to rotary dial type pulses. One of the problems with DTMF signals is that the tones used to form such signals fall in the audio frequency band. This is required because of the audio frequency bandwidth limits of contemporary telephone systems. Regardless of the reason why DTMF signals lie in the audio frequency band, tone receivers adapted to receive DTMF signals and convert them into rotary dial type pulses can erroneously respond to non-DTMF signals that lie in the audio frequency band, the most common of which are speech signals. As a result, it is desirable to inhibit the operation of tone receivers in the presence of non-DTMF audio signals and, in particular, speech signals. In order to accomplish this result it is necessary to be able to detect and respond to non-DTMF signals, such as speech signals, but not respond to DTMF signals. That is, a detector must be provided that can determine whether or not an incoming signal is a speech signal or a tone signal, and react accordingly to control the operation of the tone receiver so as to minimize errors resulting from non-DTMF signals, such as human voice signals. In this way, incorrect connections and, potentially, angry subscribers, can be avoided.

In the past, attempts to produce non-DTMF signal detectors, e.g., speech dectectors, having suitable accuracy have involved the application of concepts such as: measuring the ratio of the peak amplitude of the incoming signal to the average amplitude; and, measuring the distribution of energy in the incoming signals to determine if it is in the audio frequency band. These proposals have not been entirely satisfactory. First, the involved concepts have been difficult to implement in practical embodiments. Further, the implementations have tended to degrade the performance of the tone receiver, particularly in the presence of white noise.

Therefore, its is an object of this invention to provide a new and improved electronic detector.

It is a further object of this invention to provide an electronic detector suitable for discriminating between fluctuating signals, such as signals produced by the human voice and stable signals, such as DTMF signals.

It is another object of this invention to provide an electronic detector that is particularly suitable for use with a tone receiver to produce a speech immune tone detection system.

As will be better understood from the following description, the present invention provides a phase jitter detector for use in combination with a tone receiver to prevent the receiver from responding to fluctuating audio frequency signals, such as signals produced by the human voice. In addition to this use, the phase jitter detector includes the general ability to determine the level of noise in an incoming signal. That is, the phase jitter detector has the inherent ability to determine the signal-to-noise ratio (SNR) of a signal when its output is suitably interpreted. Since such information is useful in telephone and other electronic environments, it is also a broad object of this invention to provide a signal-to-noise ratio (SNR) measuring system.

In the past, SNR measuring systems have usually required that the output of a system in the absence of an input signal first be measured. This measurement represents the noise of the system. Then, a measurement of the output of the system in presence of a signal is made. The two measurements are then ratio combined to determine the SNR of the system. Obviously, it would be desirable to provide a system that provides SNR information in a single measurement step.

Therefore, it is a still further object of this invention to provide a new and improved SNR measuring system that determines signal-to-noise ratio in a single step.

SUMMARY OF THE INVENTION

In accordance with this invention, a phase jitter detector that is ideally suited for use in combination with tone receivers (e.g., tone-to-pulse converters) to provide a speech immune tone detection system or in a measuring instrument to provide a direct measurement of the signal-to-noise ratio (SNR) of a signal is provided. In either application, the phase jitter detector can be implemented in either phase locked loop or digital logic form. Regardless of how implemented, the wave shape of the phase jitter detector determines the phase jitter of an incoming signal by first squaring the signal (by passing the incoming signal through a high gain amplifier that limits the signal, for example). After squaring, the phase jitter of the squared wave shape signal is determined by: (1) determining the phase deviation of each cycle of the squared signal with respect to the average frequency of the squared signal over a predetermined number of cycles; preceeding and, (2) combining the phase deviation and the predetermined number of preceeding cycles information to determine phase jitter. In tone detection system applications, the phase jitter information is used to control whether or not a tone receiver is to complete a tone conversion sequence. In SNR measuring applications, the phase jitter information is converted into SNR form and displayed.

The preferred form of a phase locked loop implementation of the phase jitter detector of the invention includes a phase locked loop that receives the squared (e.g., limited) version of the incoming signal and produces an output pulse having a time duration related to the absolute value of the phase difference between the present cycle of the incoming signal and the average frequency of the previous cycles. Thus, the output pulses of the phase locked loop represent the phase deviation of each cycle of the squared signal. The output pulses of the phase locked up are utilized to control the counting of clock pulses by a digital integrator. In addition, a cycle counter is enabled to count a pulse for each cycle of the incoming signal. The output of the digital integrator, taken over a predetermined number of cycles counted by the cycle counter (n), is equal to the magnitude of the phase fluctuations (e.g., jitter) of the squared version of the incoming signal. Thus, the cycle counter and the digital integrator electronically combine the phase deviation with the number of cycles over which the deviation is measured to determine phase jitter.

A digital logic implementation of the phase jitter detector of the invention can be formed of dedicated digital logic components or a microprocessor. In either case, the phase deviation of each cycle of the squared signal is determined by: (a) producing a pulse each time a transition of the squared signal in one direction (e.g., positive to negative) occurs; (b) measuring the time between pulses ($x_i$) for said predetermined number of pulses; (c) determining the mean time between pulses ($\bar{x}$); and (d) determining the difference between the time between pulses and the mean time between pulses ($x_i - \bar{x}$). The phase jitter is then determined by combining the resulting phase difference information with the number of cycles information (n). The manner of combination is determined by the acceptable accuracy. The most accurate result is obtained using the following standard deviation estimate (s) equation:

$$s = \sqrt{\frac{1}{n-1} \sum_{i=1}^{n} (x_i - \bar{x})^2}$$

In this instance, phase jitter is defined by the value of s.

A less accurate, but more easily determined result is obtained using the following equation:

$$dm = \frac{1}{n} \sum_{i=1}^{n} |x_i - \bar{x}|$$

to determine mean phase deviation (dm) and, then, determining phase jitter using the following formula to relate standard phase deviation ($\sigma_m$) to mean phase deviation:

$$\sigma_m = \sqrt{\frac{\pi}{2}} \, dm$$

In this instance, phase jitter is defined by the value of $\sigma_m$.

Regardless of how the phase jitter detector is implemented (i.e., phase locked loop or digital logic form), in accordance with another aspect of this invention, the phase jitter detector is combined with a tone receiver to provide a speech immune tone detection system. When the phase jitter detector is implemented in phase locked loop form, this is perfectly accomplished by applying the output of the digital integrator to a level detector. If the output of the digital integrator exceeds the preset level of the level detector before the digital integrator is reset by the cycle counter, the tone receiver is inhibited. When the phase jitter detector is implemented in digital logic form, the tone receiver is inhibited when phase jitter value based on the standard deviation estimate (s), or the standard deviation ($v_m$) derived from the mean phase deviation (dm), as the case may be, exceeds a predetermined level.

In accordance with still further aspects of this invention, the phase jitter detector output is electronically manipulated to provide the SNR of the incoming signal. When the phase jitter detector is implemented in phase locked loop form, preferably, SNR data is produced by actuating a display by the cycle counter to read the output of the digital integrator just prior to the digital integrator being reset. The display can be calibrated in terms of SNR since the number of cycles are fixed, whereby the phase jitter of the squared version of the incoming signal is directly related to the noise of the incoming signal. Since the output of the digital integrator is the summation term of the mean phase deviation equation set forth above, suitable display calibration requires dividing the output of the digital integrator by the number of cycles information (n) and relating the result (e.g., dm) to standard phase deviation ($\sigma_m$) using the last equation set forth above ($\pi/2$ is, of course, a constant). Thereafter the display converts the result into SNR form using either of the digital logic form equations set forth in the next paragraph—substituting $\sigma_m$ for s. $\bar{x}$ is determined in any suitable manner, such as a tone receiver output signal denoting in time form the frequency of a received signal.

When the phase jitter detector is implemented in digital logic form, preferably SNR data is developed in accordance with the equation:

$$SNR = \frac{1}{\sqrt{2} \, \text{SIN}\left(\frac{s}{\bar{x}} \, 2\pi\right)}$$

where the argument of the SIN function is in radians. Alternatively, SNR data can be developed in accordance with the less complex equation:

$$SNR = \frac{\bar{x}}{s \, 2 \sqrt{2} \, \pi}$$

if an appropriate loss in accuracy of one percent (1%) for SNR greater than or equal to 10 dB is acceptable. In either of the foregoing equations $\sigma_m$ can be substituted for s if phase jitter is determined in the alternative manner discussed above. Regardless of how determined, the SNR data is in the form of an electronic signal that is applied to a suitable display device.

As will be readily appreciated from the foregoing summary, the phase jitter detector of the invention is an uncomplicated device ideally suited for detecting fluctuating signals, such as speech signals, and using the resulting information to control the operation of a tone receiver. While the invention was developed for use with tone receivers to prevent the operation of a tone receiver in the presence of a fluctuating audio signal, such as a speech signal, the invention is also useful in other environments to produce substantially similar results. That is, the phase jitter detector can be used in other environments to detect fluctuating signals (regardless of whether they are in the audio frequency band) and use the resulting information to control other circuits.

In addition, the invention can be utilized to measure th signal-to-noise ratio of an incoming signal based solely on information contained in the incoming signal. That is, no separate determination of the noise present in the incoming signal is necessary in order to determine the signal-to-noise ratio. Rather, a direct determination of signal-to-noise ratio based upon the information contained in the input signal can be provided by the phase jitter detector.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein.

DESCRIPTION OF THE PREFERRED EMBODIMENTS

Figure 1:
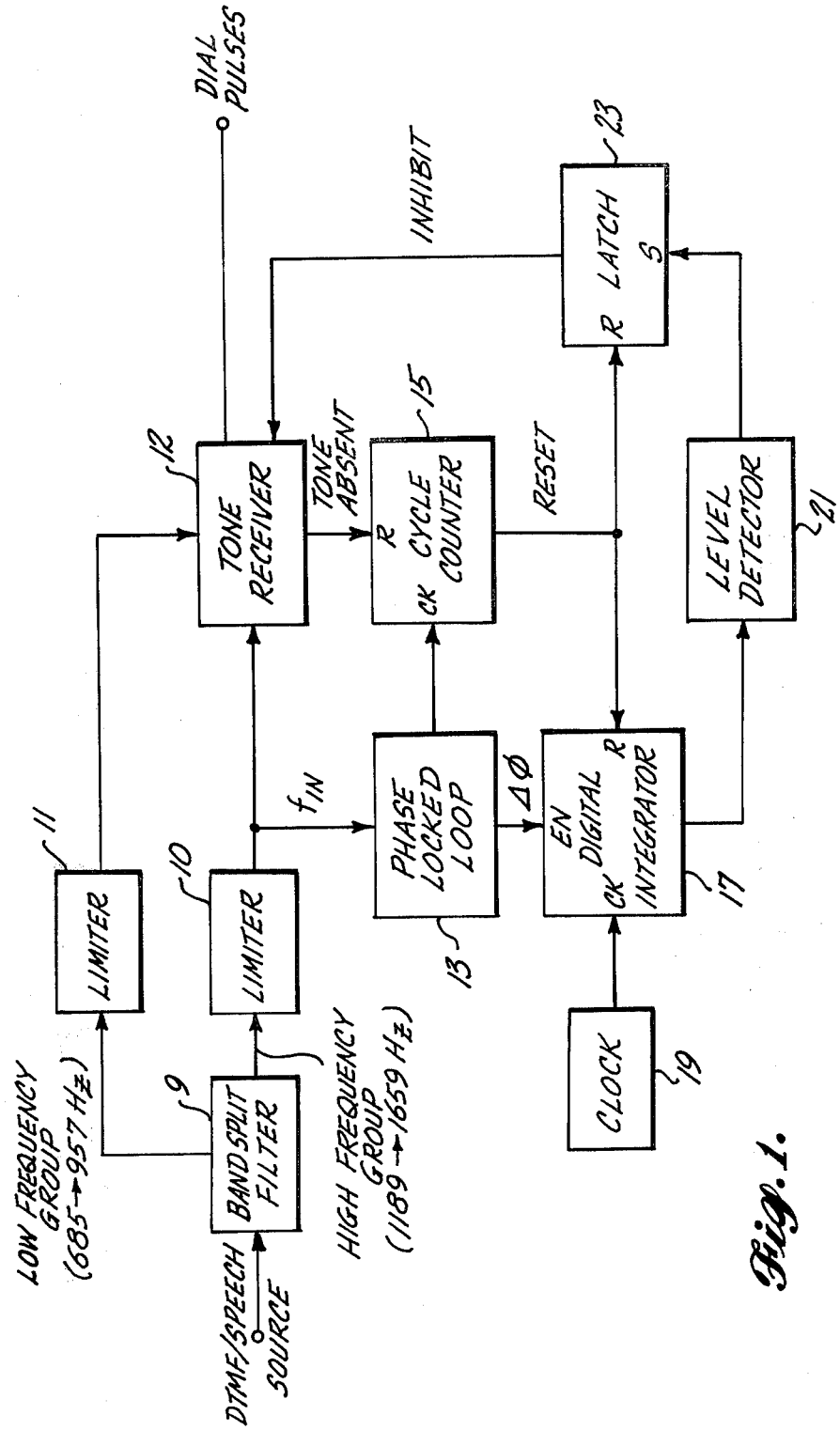
FIG. 1 is a block diagram of a speech immune tone detection system formed in accordance with the invention that includes a phase locked loop embodiment of a phase jitter detector formed in accordance with the invention connected to control the operation of a tone receiver.

FIG. 1 illustrates a speech immune tone detector formed in accordance with the invention that includes a phase locked loop embodiment of a phase jitter detector formed in accordance with the invention connected to inhibit the operation of a tone receiver 12 when a signal having a significant amount of jitter, such as a speech signal, is detected. FIG. 1 includes a bandsplit filter 9 that receives the DTMF/speech signal and splits it into high and low frequency components in a conventional manner. Signal components lying outside of the high and low frequency groups are rejected. The high frequency components, which lie in the 1189 to 1659 Hz band, are applied to a first limiter 10 and the low frequency components, which lie in the 685–957 Hz band, are applied to a second limiter 11. The outputs of the first and second limiters 10 and 11 are connected to inputs of the tone receiver 12. The limiters, in a conventional manner, square the wave shape of the high and low frequency components of the incoming signals before they are applied to the tone receiver 12. While the limiters 10 and 11 may take on various forms, the conventional form of such circuits is a high gain amplifier. FIG. 1 also includes the remaining elements of the phase locked loop embodiment of the phase jitter detector, which comprise a phase locked loop 13; a cycle counter 15; a digital integrator 17; a clock 19; a level detector 21; and, a latch 23 all illustrated in block form.

The high frequency component of the incoming signal (DTMF or speech) is shown as applied through the first limiter 10 to the input of the phase locked loop 13. This is by way of example only. If desired, the low frequency component could be applied to the phase locked loop. Or, two phase jitter detectors, one for each type of component, could be included. Regardless of how the phase jitter detector is implemented, the tone receiver must include a shortterm test that performs a preliminary evaluation of whether or not a DTMF signal is present and longer term test that ensures the validity of the tone. While the tone receiver 12 may take on various forms, by way of example, a suitable tone receiver produced by the Teltone Corporation, the assignee of the present application, is described in U.S. Pat. No. 4,145,576 entitled "DTMF and Rotary Dial Signal Receiver," by Frank Twiss. The preliminary evaluation signal produced by the tone receiver denoting the probable presence of a DTMF signal tone is applied to the reset input of the cycle counter 15. The cycle counter 15 is formed such that it is maintained in a reset state when the preliminary evaluation circuitry of the tone receiver 11 does not detect a DTMF tone.

Figure 3:
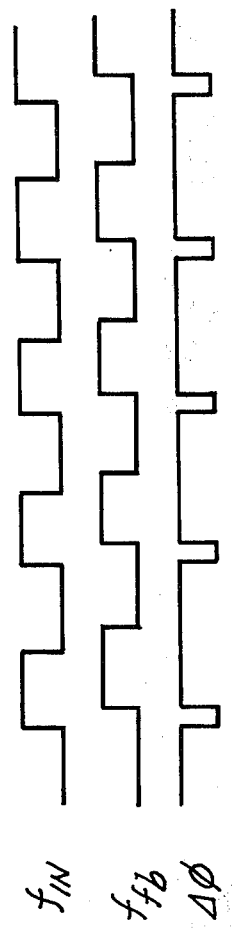
FIG. 3 is a waveform diagram used to describe the operation of the phase locked loop shown in FIG. 2.

The illustrated phase locked loop 13 produces two output signals. One of these signals has a frequency related to the frequency of the incoming signal applied to the phase locked loop. This signal may, in fact, be the square shaped version of incoming signal, $f_{IN}$. Or, it may be the output signal ($\Delta\phi$), or the feedback signal ($f_{fb}$), of the phase locked loop. This signal is applied to the clock input of the cycle counter. Since the clock signal applied to the cycle counter is defined as having a frequency related to the frequency of the incoming signal, when enabled, the cycle counter is incremented at the frequency of the incoming signal. In this regard, preferably, the cycle counter is transition clocked, i.e., it is clocked on positive-to-negative transitions (or negative-to-positive transitions), whereby the selected one of the "potential" clock signals described above can be directly connected to the cycle counter. Since only one of the chosen transition occurs during each cycle of any of these signals, which are illustrated in FIG. 3 and described below, the cycle counter is only clocked once for each cycle of the incoming signal. The output of the phase locked loop ($\Delta\phi$) denoting the phase relationship between $f_{IN}$ and the feedback signal ($f_{fb}$) of the phase locked up is applied to the enable input of the digital integrator.

The output of the cycle counter 15 is applied to the reset inputs of the digital integrator 17 and the latch 23. More specifically, the cycle counter produces an output signal that changes state each time the cycle counter counts a predetermined number of pulses. The output may be derived from a selected stage of the cycle counter or a decoder (not shown) connected to several stages of the cycle counter.

The clock 19 is connected to the clock input of the digital integrator 17. In a conventional manner, when the reset output of the cycle counter 15 is in its non-reset state and the digital integrator is enabled by the state of the output ($\Delta\phi$) of the phase locked loop 13, the digital integrator 17 counts the clock pulses produced by the clock 19. In this regard, preferably, the digital integrator is enabled when $\Delta\phi$ is in a binary zero (0) state.

The output of the digital integrator 17 is connected to the input of the level detector 21. When the pulse count of the digital integrator reaches a predetermined level, the output of the level detector switches states. The output of the level detector is connected to the set input of the latch 23. The connection is such that when the digital integrator output reaches the predetermined level, whereby the output of the level detector switches states, the latch 23 is set. An output of the latch 23 is connected to an inhibit input of the tone receiver 12.

Figure 2:
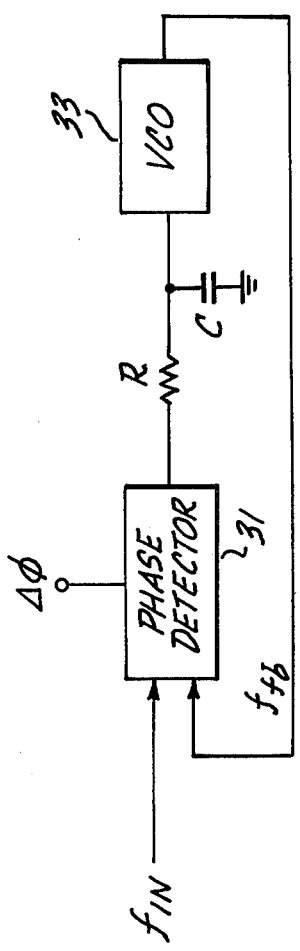
FIG. 2 is a partially block and partially schematic diagram of a phase locked loop suitable for use in the phase jitter detector illustrated in FIG. 1.

Prior to describing the operation of the phase jitter detector illustrated in FIG. 1, a phase locked loop suitable for use in the phase jitter detector is described. In this regard, attention is directed to FIGS. 2 and 3. FIG. 2 illustrates, in block form, a phase locked loop suitable for use in the phase jitter detector illustrated in FIG. 1 and comprises a phase detector 31; a voltage controlled oscillator (VCO) 33; a resistor designated R; and, a capacitor designated C. The squared version of the incoming signal ($f_{IN}$) is applied to one input of the phase detector 31. The output of the phase detector is connected through R to the input of the VCO. The input of the VCO 33 is also connected through C to ground. Consequently, the R/C circuit forms an integrator that integrates the output of the phase detector. The output of the VCO is the feedback signal ($f_{fb}$) of the phase locked loop and is applied to the other input of the phase detector 31.

In operation, the phase detector 31 produces bidirectional pulses having a duration equal to the phase difference between $f_{IN}$ and $f_{fb}$. More specifically, the phase difference between $f_{IN}$ and $f_{fb}$ (lines one and two of FIG. 3) is denoted by the time duration between the leading edges of these two signals. The time duration takes the form of pulses that are applied to the R/C integrator. The polarity of the phase detector output pulses applied to the R/C integrator is positive or negative, depending upon the leading and lagging relationship between $f_{IN}$ and $f_{fb}$. If one signal is leading the other, the pulses are positive and if the other signal is leading, the pulses are negative. These bipolar pulses add to or decrease the charge on C, which charge controls the frequency of the signal produced by the VCO in a conventional manner. In summary, the charge on C is increased or decreased based on the leading/lagging relationship between $f_{IN}$ and $f_{fb}$ and by an amount related to the phase difference between these two signals.

While the output of the phase detector applied to the R/C integrator is bidirectional, the phase detector can also be structured to produce a pulse output that is unidirectional, i.e., all of the pulses have the same polarity, by inverting pulses of one polarity and summing them with the pulses of the other polarity, for example. It is this form of pulse output that is applied to the enable input of the digital integrator 17, and is denoted $\Delta\phi$ in FIG. 2. Thus, as shown in FIG. 3, the $\Delta\phi$ pulses are unidirectional (negative going) and have a duration that is related to the phase difference between the leading edges of $f_{IN}$ and $f_{fb}$.

When enabled, the digital integrator 17 counts pulses from the clock source 19 for a time period related to the duration of the negative $\Delta\phi$ pulses, which, as just described, denotes the phase difference between $f_{IN}$ and $f_{fb}$. $f_{fb}$, of course, denotes the average frequency of the preceding cycles of $f_{IN}$. More specifically, the voltage level of the integrated output of the phase detector, i.e., the charge on C, is directly related to the average frequency of the incoming signal. Since the frequency of the output of the VCO is directly related to its input voltage, in this case the charge on C, the frequency of the output of the VCO is the average of the frequency of $f_{IN}$. Since the phase detector 31 continuously compares the present cycle with the average frequency of the preceding cycles, the duration of $\Delta\phi$ is directly related to the phase deviation between the present cycle and the average frequency of the preceding cycles. As a result, the basis on which the digital integrator 17 integrates or sums is the absolute value of the phase deviation or, stated another way, the phase jitter of the signal applied to the phase locked loop.

Turning now to a summary description of the operation of the phase jitter detector illustrated in FIG. 1; as previously described, in the absence of an incoming signal the cycle counter 15 is maintained in a reset state by the tone receiver. The cycle counter 15, the digital integrator 17, and the latch 23 are formed such that when the cycle counter is held in a reset state the digital integrator and the latch are also held in reset states.

As soon as the tone receiver detects an incoming signal that may be a valid DTMF signal, the cycle counter output of the toner receiver shifts to a state that allows the cycle counter 15 to count. As previously described, thereafter, the cycle counter is incremented at a rate related to the frequency of the incoming signal; preferably once for each cycle of the incoming signal. The incrementing may be caused by the leading or trailing edge of $f_{IN}$, $\Delta\phi$ or $f_{fb}$. $f_{IN}$ or $f_{fb}$ are preferred because a $\Delta\phi$ signal may not be generated if the output of the VCO($f_{fb}$) and $f_{IN}$ are in phase.

As previously discussed, the digital integrator 17 counts clock pulses based on the phase difference between $f_{fb}$ and $f_{IN}$, which is the phase difference between the present cycle of the incoming signal and the average frequency of the previous cycles. If the digital integrator counts up to a predetermined level, prior to the cycle counter counting up to a point where it produces a reset pulse, the output of the level detector shifts states and sets the latch 23. As a result, the tone receiver is inhibited. Contrariwise, if the cycle counter produces a reset pulse prior to the digital integrator output reaching the predetermined level, the output of the level detector 21 does not shift states and the latch 23 is not set. In the first case the phase deviation or jitter of the incoming signal summed by the digital integrator is high and indicates that it is an unacceptable speech (or other undesirable) signal. In the latter case the phase jitter summed by the digital integrator is low, indicating that the incoming signal is an acceptably stable DTMF signal tone.

As noted above, in addition to being used in combination with a tone receiver to produce a speech immune system, the phase jitter detector can also be used to measure the signal-to-noise ratio (SNR) of a signal. A phase locked loop based system formed in accordance with the invention for measuring the SNR of a signal is illustrated in FIG. 4 and next described.

Figure 4:
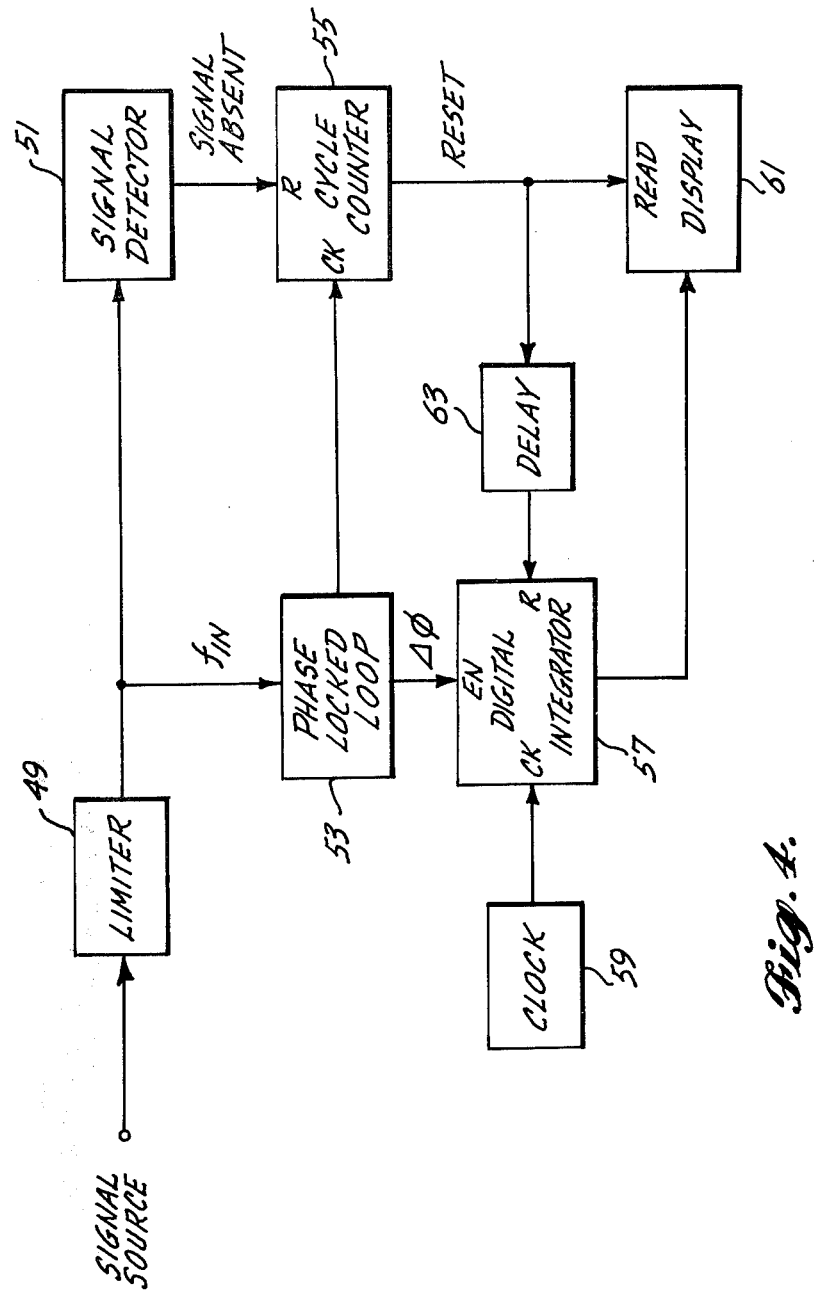
FIG. 4 is a block diagram of a phase locked loop embodiment of a signal-to-noise ratio measuring system formed in accordance with the invention.

The SNR measuring system illustrated in FIG. 4 comprises a limiter 49; a signal detector 51; a phase locked loop 53; a cycle counter 55; a digital integrator 57; a clock 59; a display 61; and, a delay 63. The signal whose SNR is to be measured is applied to the input of the limiter, which may take the form of a high gain amplifier. The output of the limiter is a square wave signal whose jitter is directly related to the noise content of the original input signal.

The output of the limiter 49, denoted $f_{IN}$, is connected to the inputs of the signal detector 51 and the phase locked loop 53. The signal detector is adjusted to detect the presence of the square wave version of the signal whose SNR is to be measured and may take on any well known form, such as a frequency detector, for example. The output of the signal detector is connected to the reset input of the cycle counter 55 and maintains the cycle counter reset in the absence of a suitable signal being detected by the signal detector.

As with the phase jitter detector illustrated in FIG. 1 and previously described, the phase locked loop produces an output, such as a positive-to-negative transition, that occurs at the frequency of the incoming signal, e.g., once for each cycle of $f_{IN}$. This output is applied to the clock input of the cycle counter and causes the cycle counter to be incremented at the frequency of the incoming signal (i.e., once for each cycle of the incoming signal), when the cycle counter is enabled to count as a result of a suitable signal being detected by the signal detector 51.

As previously described with respect to FIG. 2, the phase locked loop produces negative pulses ($\Delta\phi$) whose duration is equal to the phase deviation between $f_{IN}$ and the feedback signal ($f_{fb}$) of the phase locked loop. As before, $f_{IN}$ is the present signal frequency and $f_{fb}$ is the average frequency of prior cycles of $f_{IN}$. Thus, $\Delta\phi$ is related to the jitter of the squared version of the incoming signal. The $\Delta\phi$ pulses are applied to the enable input of the digital integrator 57. The clock 59 applies clock pulses to the clock input of the digital integrator 57. Thus, the total pulses counted by the digital integrator is related to the sum or total duration of the $\Delta\phi$ pulses, i.e., the sum of the phase difference.

The output of the digital integrator is connected to the signal input of the display 61. The output of the cycle counter 55 is connected to the read control input of the display 61 and through the delay 63 to the reset input of the digital integrator.

In operation, when the signal detector detects the presence of the incoming signal whose SNR is to be measured, the cycle counter is enabled (i.e., it is no longer held in a reset state). Thereafter, the phase jitter of the square shaped version of the incoming signal is determined in the manner previously described. As noted above, the phase jitter of the square shaped version of the incoming signal is directly related to the noise contained in the incoming signal. Just prior to the cycle counter resetting the digital integrator, the display reads the output of the digital integrator. This output is stored in suitable storage latches forming part of the display. The display output is calibrated in terms of signal-to-noise ratio (SNR), which is readily achieved using Equations (2) and (3), plus Equations (4) or (5) set forth below since the output of the digital integrator is the summation portion of Equation (2). Since all of the terms of these equations, e.g., n, $\bar{x}$, $\pi$ are known, the conversion is readily accomplished by the display using conventional circuitry. ($\bar{x}$ is, of course, determined by the signal detector, which, as previously described, responds to the frequency of the signal whose SNR value is to be determined. Alternatively, the value of $\bar{x}$ is readily calculated in the manner described below).

Figure 5:
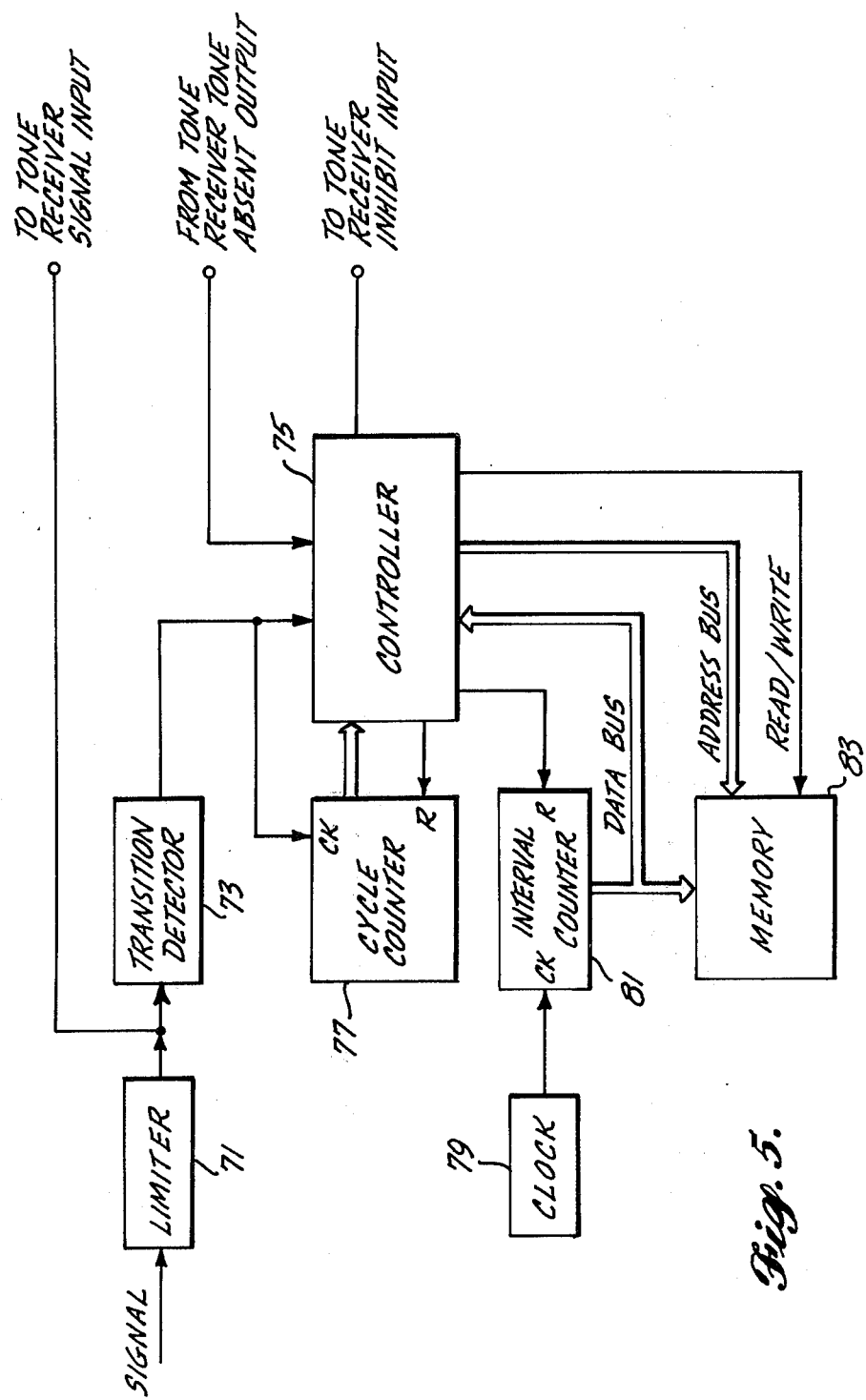
FIG. 5 is a block diagram of a digital logic embodiment of a phase jitter detector formed in accordance with the invention suitable for controlling the inhibiting of a tone receiver.
Figure 7:
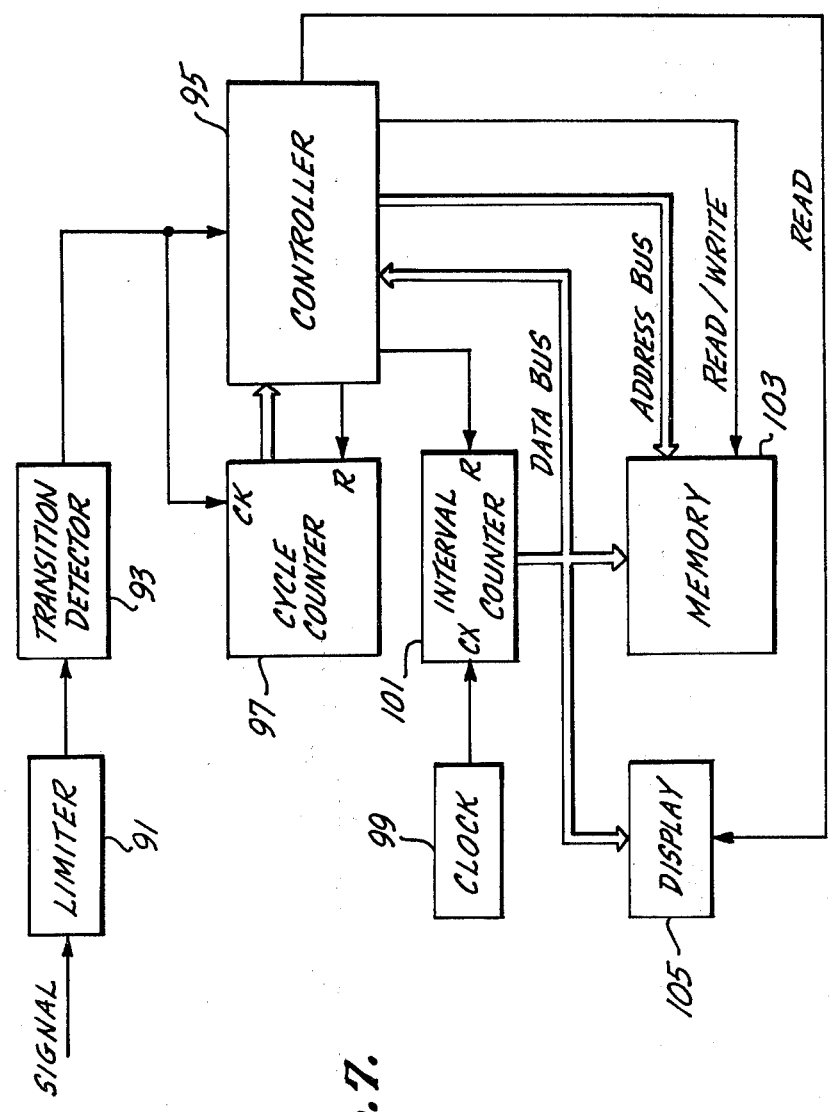
FIG. 7 is a block diagram of a digital logic embodiment of a signal-to-noise ratio measuring system formed in accordance with the invention; and, FIG. 8 is a flow diagram illustrating the operation of the controller illustrated in FIG. 7.

As noted above, the phase jitter detector of the invention can be implemented in digital logic form as well as phase locked loop form. Moreover, either form can be utilized to create a speech immune tone detection system or an SNR measuring system. FIGS. 5 and 7, respectively, illustrate such systems. Prior to describing these systems, it should be noted that both figures illustrate their respective systems in discrete dedicated logic form that includes counters, a memory and a controller. As will be readily recognized by those familiar with microprocessors, the invention can also be implemented in microprocessor form, wherein the function of certain of the components illustrated in FIGS. 5 and 7 would be implemented in a different manner. For example, a memory bin could perform the function of a discrete counter by reading out the previous value in memory each time a count value is to be incremented, increasing the old value by one and reinserting the new value back into the same memory bin. Such structural arrangements clearly fall within the digital logic embodiments of the invention hereinafter described. Similarly, it should be understood that a unitary microprocessor could combine the phase jitter detection and tone receiver functions herein illustrated and described in a composite structure. That is, a suitably programmed microprocessor could carry out both functions, rather than implementing each item as a separate microprocessor or as a set of dedicated logic components. Such a composite microprocessor system clearly falls within the spirit and scope of the invention.

Turning now to FIG. 5, which illustrates a digital logic embodiment of a phase jitter detector formed in accordance with the invention suitable for use with a tone receiver of the type described in U.S. Pat. No. 4,145,576 to provide a speech immune tone detection system. The digital logic embodiment of the phase jitter detector formed in accordance with the invention illustrated in FIG. 5; includes: a limiter; 71; a transition detector 73; a controller 75; a cycle counter 77; a clock 79; an interval counter 81; and, a memory 83. The memory may, for example, be a random access memory (RAM).

The incoming signal is applied to the limiter 71, which squares the wave shape of the incoming signal in the manner previously described. The limiter may, for example, comprise a high gain amplifier. As with FIG. 1, preferably, only one of the high (or low) frequency components of the incoming signal is tested for phase jitter, even though both components could be tested by separate phase jitter detectors implemented in digital logic form. In the latter case, of course, either detector could produce a tone receiver inhibiting signal.

The output of the limiter 71 is suitable for connection to the related (e.g., high or low) input of the tone receiver, as illustrated in FIG. 1 and previously described. The output of the limiter 71 is also connected to the input of the transition detector 73. The transition detector 73 detects transitions of the square shaped version of the incoming signal in one direction or the other, i.e., positive-to-negative or negative-to-positive. Each time the selected type of transition occurs, the transition detector 73 produces a pulse that is applied to the controller 75 and the clock input of the cycle counter 77. The controller 75 is also connected to receive the signal from the tone absent output of the tone receiver. As previously described, when the tone receiver preliminarily determines that the incoming signal is a potentially valid DTMF signal tone, the tone absent output of the tone receiver carries a suitable output signal. For example, the output may shift from a binary zero (0) to a binary one (1) state, or vice versa. The controller is also connected to the reset input of the cycle counter 77 and maintains the cycle counter 77 reset until the controller receives a signal from the tone receiver indicating that the tone receiver has determined, that an incoming signal is a potentially valid DTMF signal. Alternatively, the controller could make its own decision in this regard by merely measuring the time between pulses to determine if the received signal is a potentially valid tone of a DTMF signal tone.

In addition to being connected to the reset input of the cycle counter 77, the controller 75 is also connected to the reset input of the interval counter 81. The clock input of the interval counter 81 is connected to the output of the clock 79. The output of the interval counter 81 is connected to a data bus that runs to the controller 75 and to the memory 83. Further, the controller is connected to the memory 83 via an address bus and via a read/write control line.

Figure 6:
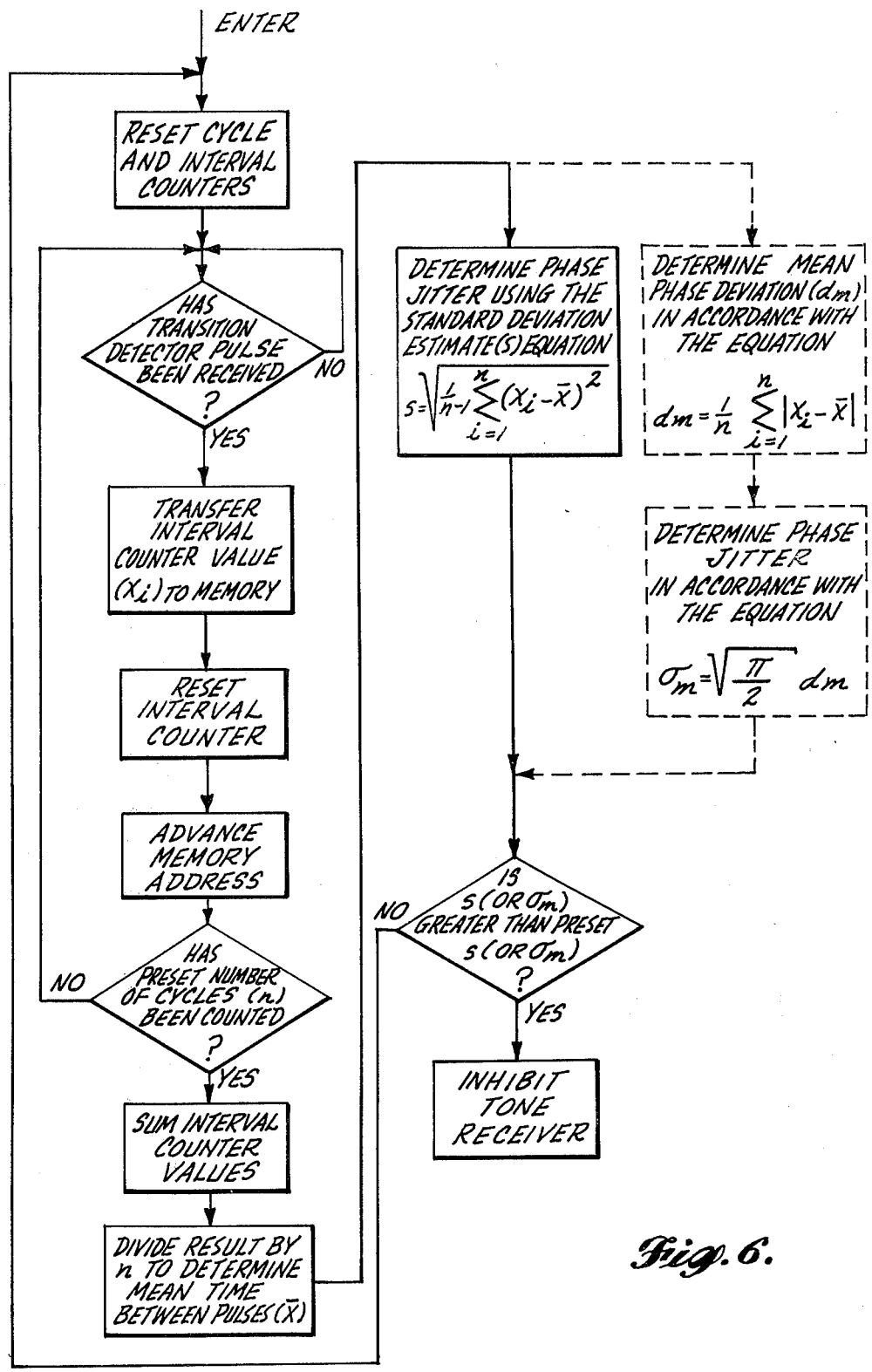
FIG. 6 is a flow diagram illustrating the operation of the controller illustrated in FIG. 5.

FIG. 6 is a flow diagram illustrating the operation of the phase jitter detector illustrated in FIG. 5 after the controller has received a signal from the tone receiver indicating that the incoming signal is a potentially valid DTMF signal tone. The controller first applies a reset signal to the cycle counter 77 and the interval counter 81 to reset both counters. Thereafter, the interval counter starts counting clock pulses produced by the clock 79. The controller now continuously tests the output of the transition detector until the next transition detector pulse is produced. When the next transition detector pulse is received by the controller 75, the controller applies a read signal to the memory 83, which causes the count value ($x_i$) of the interval counter to be transferred to the bin in memory addressed by the signal on the address bus, which is also produced by the controller 75. Next, the controller 75 resets the interval counter and then advances the memory address to the next bin. Thereafter, the controller performs a test to determine whether or not the preset number of cycles (n) have been counted by the cycle counter 77. If not, the previous cycle of operation is repeated.

After the cycle counter has counted up to the value of the present number of cycles (n), all of the interval counter values ($x_i$) stored in memory are sequentially read out of the various memory bins (in a nondestruct manner) and summed. The results of the summation are divided by the value of n to determine the mean time between pulses ($\bar{x}$). As will be readily appreciated by those skilled in the art and others, the values of $x_i$ and $\bar{x}$ are inversely related to the frequency of the signals to which they relate. More specifically, the values of $x_i$ are inversely related to the frequency of each cycle of the incoming signal. The value of $\bar{x}$ is inversely related to the mean frequency of the incoming signal.

After the value of $\bar{x}$ has been determined, a phase jitter is determined using the standard deviation estimate (s) equation:

$$s = \sqrt{\frac{1}{n-1} \sum_{i=1}^{n} (x_i - \bar{x})^2} \quad (1)$$

The value of s denotes the amount of phase jitter. The standard deviation "estimate" equation rather than the standard deviation ($\sigma$) equation is used because standard deviation cannot be exactly determined without taking an infinite number of samples. However is within one percent (1%) of $\sigma$ if n is greater than fifty (50), using Equation (1). It is pointed out that $n-1$ is used in the numerator of Equation (1), rather than n, because, statistically, the equation is more correct using this Bessel correction technique, i.e., using $n-1$ rather than n.

In some instances, Equation (1) may be more complicated than desirable to carry out. In such instances, if a less accurate phase jitter value is acceptable, phase jitter can be determined by first determining the mean phase deviation (dm) in accordance with the equation:

$$dm = \frac{1}{n} \sum_{i=1}^{n} |x_i - \bar{x}| \quad (2)$$

Thereafter, the standard phase deviation ($\sigma_m$) can be determined in accordance with the equation:

$$\sigma_m = \sqrt{\frac{\pi}{2}} \, dm \quad (3)$$

In this instance, $\sigma_m$ denotes the amount of phase jitter.

Regardless of how phase jitter is determined, i.e., based on estimated standard deviation or based on mean phase deviation converted to standard phase deviation, the controller makes a test to determine whether or not the determined value is greater than a preset value. If the determined value is greater than the preset value (indicating that the phase jitter of the incoming signal is unacceptably high and, thus, the incoming signal is an audio signal other than a DTMF signal tone), the tone receiver is inhibited. Contrariwise, if the determined value is less than the present value, the controller returns to the point where the cycle and interval counters are reset and the foregoing sequence of steps is repeated.

At this point, it should be clear that the phase jitter value, regardless of whether it is "estimated" or based on mean phase deviation, includes a determination of the phase deviation or jitter of each cycle of the incoming signal tone being analyzed. In this regard, both the standard phase deviation estimate Equation (1) and the mean phase deviation Equation (2) include the term $x_i$-$\bar{x}$. As discussed above, $x_i$ is inversely related to the frequency of each cycle of the incoming signal. $\bar{x}$ is inversely related to the average frequency of the incoming signal. Consequently, $x_i$-$\bar{x}$ is inversely related to the phase deviation or phase jitter of the incoming signal tone.

Figure 8:
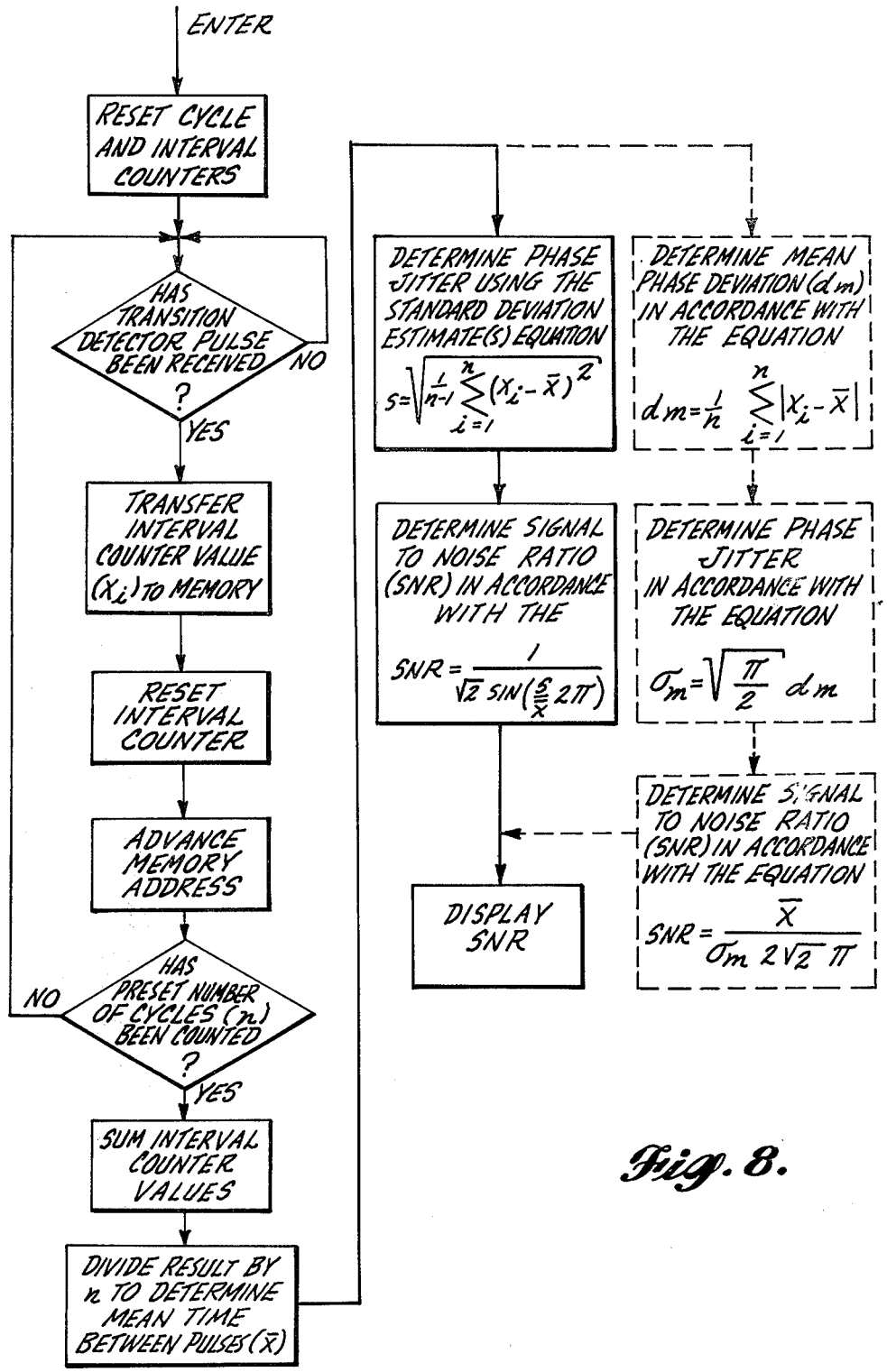

FIG. 7 is a block diagram of a digital logic based SNR measuring system formed in accordance wtih the invention. The SNR measuring system illustrated in FIG. 7 comprises: a limiter 91; a transition detector 93; a controller 95; a cycle counter 97; a clock 99; interval counter 101; a memory 103; and the display 105. The limiter 91, transition detector 93, cycle counter 97, clock 99, interval counter 101 function in the same manner as the similarly named components illustrated in FIG. 5 and heretofore described. Consequently, the interconnection of these components and their operation will not be reiterated. Controller 95 functions in a slightly different manner, which is illustrated in FIG. 8 and described below. The controller is, however, connected to the interval counter 101 and the memory 103 via a data bus, an address bus and a read/write control line. The data bus is also connected to the data input of the display 105. Further, the controller 105 is connected to the display 105 via a read control line.

Turning now to a description of the operation of the SNR measuring system illustrated in FIG. 7; in the manner previously described, the limiter 91 squares the wave shape of the incoming signal and the transition detector produces a pulse each time a square wave transition in one direction or the other (but not both) occurs. Each time the controller receives a pulse, the cycle counter 97 and interval counter 101 are reset. Thereafter, as illustrated in FIG. 8 and previously described with respect to FIG. 6, the controller idles until the next pulse is received from the transition detector. Then, the interval counter value ($x_i$), which is inversely related to the frequency of the just completed cycle of the incoming signal, is transferred to a suitable bin in the memory 103. Thereafter, the interval counter is reset and the memory address is advanced. Next, the controller tests the output of the cycle counter 97 to determine if the preset number of cycles (n) have been counted. If not, the controller cycles back to the idle point. When the preset number of cycles (n) have been counted by the cycle counter 97, the interval counter value stored in the memory bins are nondestructively read out and summed. Thereafter, the results of the summation is divided by the value of n to determine the mean time between pulses ($\bar{x}$). As previously described $\bar{x}$ is inversely related to the mean frequency of the incoming signal. Then, either phase jitter is determined in accordance with Equation (1) or in accordance with Equations (2) and (3). Which route is followed depends on desired accuracy and acceptable system complexity. Next, the signal-to-noise ratio (SNR) is determined. If an accurate SNR value is desired, the following equation is used.

$$SNR = \frac{1}{\sqrt{2} \sin\left(\frac{s}{\bar{x}} 2\pi\right)} \quad (4)$$

Contrariwise, if a less accurate, but more easily obtainable SNR is desired, the following equation is used:

$$SNR = \frac{\bar{x}}{\sigma_m 2 \sqrt{2} \pi} \quad (5)$$

Regardless of how the phase jitter value (i.e., s or $\sigma_m$) is determined, either Equation (4) or Equation (5) can be used to determine the SNR value. When Equation (5) is used, as opposed to Equation (4), to determine the SNR value, the result has less than one percent (1%) error for SNR values equal to or greater than 10 dB.

Regardless of how it is obtained, after the SNR value is obtained it is applied to the display 105. More specifically, the controller 95 applies the SNR value to the data bus and a read signal to the read line connected to the display 105.

As noted above, the digital logic based embodiments of the invention illustrated in FIGS. 5 and 7 are to be taken as exemplary, not limiting. Various changes and modifications, both in discrete types of digital logic devices as well as composite microprocessor systems, fall within the spirit and scope of the invention. Similarly, the phase locked loop embodiment of the invention heretofore described can be changed. Consequently, while preferred embodiments of the invention have been illustrated and described, it will be appreciated that various changes can be made therein without departing from the spirit and scope of the invention. For example, the mean phase deviation (dm) value obtained in accordance with Equation (2), rather than the standard phase deviation ($\sigma_m$) value obtained in accordance with Equation (3), can be tested to determine if the tone receiver is or is not to be inhibited since the conversion from mean to standard phase deviation is a constant ($\sqrt{\pi/2}$). Thus, the invention can be practiced otherwise than as specifically described herein.

The embodiments of the invention in which an exclusive property or privilege is claimed are defined as follows:

1. A phase jitter detector for determining the phase jitter of an incoming signal comprising:

(A) squaring means for receiving and squaring the wave shape of said incoming signal; and,
(B) electronic circuit means coupled to said squaring means for determining the phase jitter of said incoming signal by: (i) determining the phase difference between each cycle of the squared incoming signal and the average frequency of the squared incoming signal over a predetermined number of preceeding cycles of the incoming signal; and, (ii) combining said phase difference information and said predetermined number of cycles information to determine the phase jitter of said incoming signal, said electronic circuit means including:
   (1) phase determining means coupled to said squaring means for determining the phase difference between each cycle of the squared incoming signal and the average frequency of the preceeding cycles of said squared incoming signal and producing an output signal containing said phase difference information;
   (2) cycle counting means incremented at a rate related to the frequency of said incoming signal; and,
   (3) digital integrating means coupled to said phase determining means and to said cycle counting means for integrating the output of said phase determining means containing said phase difference information over a predetermined number of cycles of said incoming signal counted by said counting means, said integrated output signal information defining the phase jitter of said incoming signal over the predetermined number of cycles counted by said cycle counting means.

2. A phase jitter detector as claimed in claim 1 wherein said phase determining means is a phase locked loop.

3. A phase jitter detector as claimed in claim 2 wherein said cycle counting means is a cycle counter having a clock input connected to receive a signal having a frequency related to the frequency of said incoming signal.

4. A phase jitter detector as claimed in claim 3 wherein said digital integrating means includes a clock and a digital integrator having clock, enable and reset inputs, the output of said clock being coupled to the clock input of said digital integrator to apply clock pulses to said digital integrator, the phase difference output of said phase locked loop connected to the enable input of said digital integrator such that said digital integrator is enabled based on the phase difference information produced by said phase locked loop and the reset input of said digital integrator coupled to a predetermined output of said cycle counter.

5. A phase jitter detector as claimed in claim 4 including:
a level detector connected to the output of said digital integrator for switching from a first state to a second state when the output of said digital integrator reaches a predetermined level; and
a latch, said latch having set and reset inputs, the set input of said latch connected to the output of said level detector and the reset input of said latch connected to said predetermined output of said cycle counter whereby said latch is set when the output of said digital integrator reaches a predetermined level and reset when the output of said cycle counter reaches a predetermined value.

6. A phase jitter detector for determining the phase jitter of an incoming signal comprising:
   (A) squaring means for receiving and squaring the wave shape of said incoming signal; and,
   (B) electronic circuit means coupled to said squaring means for determining the phase jitter of said incoming signal by: (i) determining the phase difference between each cycle of the squared incoming signal and the average frequency of the squared incoming signal over a predetermined number of preceeding cycles of the incoming signal; and, (ii) combining said phase difference information and said predetermined number of cycles information to determine the phase jitter of said incoming signal, said electronic circuit means including digital logic means for:
   (1) measuring the time between preselected directional transitions of said squared incoming signal ($x_i$) over said predetermined number of cycles (n) of said incoming signal;
   (2) determining the mean time between said preselected directional transitions of said squared incoming signal ($\bar{x}$);
   (3) determining the phase difference between each of said measured time between transitions and said mean time between transitions ($x_i-\bar{x}$); and,
   (4) determining the phase jitter of said incoming signal based on said phase difference information and said predetermined number of cycles.

7. A phase jitter detector as claimed in claim 6 wherein phase jitter is determined in accordance with the standard deviation estimate equation:

$$s = \sqrt{\frac{1}{n-1} \sum_{i=1}^{n} (x_i - \bar{x})^2}$$

where the value of s is the phase jitter value.

8. A phase jitter detector as claimed in claim 6 wherein phase jitter is determined by first determining mean phase deviation (dm) in accordance with the equation:

$$dm = \frac{1}{n} \sum_{i=1}^{n} |x_i - \bar{x}|$$

and then relating phase jitter to mean phase deviation in accordance with the equation:

$$\sigma_m = \sqrt{\frac{\pi}{2}} \, dm$$

where the value of $\sigma_m$ is the phase jitter value.

9. A phase jitter detector as claimed in claim 6 wherein said digital logic means includes:
   (A) a transition detector connected to the output of said squaring means for producing a pulse each time said preselected directional transition of said incoming signal occurs;
   (B) cycle counting means for counting pulses produced by said transition detector;
   (C) a clock for producing clock pulses;
   (D) interval counting means connected to said clock for counting clock pulses between the production of pulses by said transition detector, said clock pulse counts defining the values of $x_i$;
   (E) a memory connected to said counting means; and,
   (F) a controller connected to said transition detector, said cycle counting means, said interval counting means and said memory for:
   (1) transferring said clock pulse counts that define the values of $x_i$ to said memory and, then, resetting said interval counting means each time a pulse is produced by said transition detector;
   (2) summing said clock pulse counts that define the values of $x_i$ and are stored in memory each time said cycle counting means counts up to a value equal to said predetermined number of cycles (n);
   (3) determining said phase deviation between each of said measured time between transitions and said mean time between transitions ($x_i-\bar{x}$); and,
   (4) determining said phase jitter of said incoming signal based on said phase deviation information and said predetermined number of cycles.

10. A phase jitter detector as claimed in claim 9 wherein phase jitter is determined in accordance with the standard deviation estimate equation:

$$s = \sqrt{\frac{1}{n-1} \sum_{i=1}^{n} (x_i - \bar{x})^2}$$

where the value of s is the phase jitter value.

11. A phase jitter detector as claimed in claim 9 wherein phase jitter is determined by first determining mean phase deviation (dm) in accordance with the equation:

$$dm = \frac{1}{n} \sum_{i=1}^{n} |x_i - \bar{x}|$$

and then relating phase jitter to mean phase deviation in accordance with the equation:

$$\sigma_m = \sqrt{\frac{\pi}{2}} \, dm$$

where the value of $\sigma_m$ is the phase jitter value.

12. A speech immune tone detection system comprising:
   (A) a squaring circuit for receiving an incoming signal and squaring the wave shape of said signal;
   (B) a tone receiver coupled to the output of said squaring circuit for receiving said squared incoming signal and determining whether or not said squared incoming signal is a valid tone signal, said tone receiver formed so as to perform short and long-term checks of said squared incoming signal to determine whether or not said incoming signal is a valid tone signal, said tone receiver producing a preliminary evaluation output signal when said squared incoming signal passes said short-term check;
   (C) electronic circuit means coupled to said squaring circuit and said tone receiver for determining the phase jitter of said incoming signal and inhibiting the operation of said tone receiver when said phase jitter is determined to be above a predetermined level by:
   (1) determining the phase difference between each cycle of the squared incoming signal and the average frequency of the squared incoming signal over a predetermined number of preceeding cycles of the incoming signal;

(2) combining said phase difference information and said predetermined number of cycles information to determine the phase jitter of said incoming signal; and, (3) inhibiting said tone receiver if said phase jitter lies above a predetermined level.

13. A speech immune tone detection system as claimed in claim 12 wherein said electronic circuit means includes:

a cycle counter having clock and reset inputs, said reset input coupled to said tone receiver to receive said preliminary evaluation output signal, said cycle counter being maintained reset until said preliminary evaluation output signal denotes that said incoming signal has passed said short-term check, said clock input of said cycle counter connected to receive clock signals at a rate related to the frequency of said incoming signal;

phase determining means connected to said squaring means for receiving said squared incoming signal and determining the phase difference between each cycle of said squared incoming signal and the average frequency of the preceding cycles of said squared incoming signal and producing a related phase difference output signal;

digital integrating means connected to said phase determining means for integrating said phase difference output signal of said phase determining means, the output of said cycle counter means connected to said digital integrating means to reset said digital integrating means to an initial state when said cycle counter output reaches a predetermined level; and, inhibiting means connected to the output of said digital integrating means for inhibiting said tone receiver when the output of said digital integrating means reaches a predetermined level before said cycle counter resets said digital integrating means.

14. A speech immune tone detecting system as claimed in claim 13 wherein said inhibiting means comprises a level detector having its input connected to the output of said digital integrating means.

15. A speech immune tone detector as claimed in claim 14 wherein said inhibiting means also includes a latch having set and reset inputs, the set input of said latch being connected to the output of said level detector so that said latch is set when said output of said level detector detects that said digital integrating means has reached said predetermined level, an output of said latch being connected to an inhibit input of said tone receiver.

16. A speech immune tone detector system as claimed in claim 15 wherein said phase determining means comprises a phase locked loop having its signal input connected to the output of said squaring circuit and its phase difference output connected to the enable input of said digital integrating means.

17. A speech immune tone detector system as claimed in claim 16 wherein said phase locked loop also produces an output signal having a frequency related to the frequency of said incoming signal, said output signal being connected to the clock input of said cycle counting means.

18. A speech immune tone detector system as claimed in claim 17 wherein:

said cycle counting means comprises a cycle counter; and, said digital integrating means comprises a clock and a digital integrator having clock, enable and reset inputs, the output of said clock being connected to the clock input of said digital integrator, the phase difference output of said phase locked loop being connected to the enable input of said digital integrator and the output of said cycle counter being connected to the reset input of said digital integrator, the output of said digital integrator being connected to the input of said level detector.

19. A speech immune tone detector system as claimed in claim 18 wherein the output of said cycle counter is also connected to the reset input of said latch.

20. A speech immune tone detector system as claimed in claim 16 wherein:

said cycle counting means comprises a cycle counter; and, said digital integrating means comprises a clock and a digital integrator having clock, enable and reset inputs, the output of said clock being connected to the clock input of said digital integrator, the phase difference output of said phase locked loop being connected to the enable input of said digital integrator and the output of said cycle counter being connected to the reset input of said digital integrator, the output of said digital integrator being connected to the input of said level detector.

21. A speech immune tone detector system as claimed in claim 20 wherein the output of said cycle counting means is also connected to the reset input of said latch.

22. A speech immune tone detector system as claimed in claim 13 wherein said phase determining means comprises a phase locked loop having its signal input connected to the output of said squaring circuit and its phase difference output connected to the enable input of said digital integrating means.

23. A speech immune tone detector system as claimed in claim 22 wherein:

said cycle counting means comprises a cycle counter; and, said digital integrating means compries a clock and a digital integrator having clock, enable and reset inputs, the output of said clock being connected to the clock input of said digital integrating means, the phase difference output of said phase locked loop being connected to the enable input of said digital integrating means and the output of said cycle counter being connected to the reset input of said digital integrating means, the output of said digital integrating means being connected to the input of said inhibiting means.

24. A speech immune tone detection system as claimed in claim 12 wherein said electronic circuit means includes digital logic means for:

(A) measuring the time between preselected directional transitions of said squared incoming signal ($x_i$) over said predetermined number of cycles (n) of said incoming signal;

(B) determining the mean time between said preselected directional transitions of said squared incoming signal ($\bar{x}$);

(C) determining the phase deviation between each of said measured time between transitions and said mean time between transitions ($x_i - \bar{x}$); and (D) determining the phase jitter of said incoming signal based on said phase deviation information and said predetermined number of cycles.

25. A speech immune tone detection system as claimed in claim 24 wherein phase jitter is determined in accordance with the standard deviation estimate equation:

$$s = \sqrt{\frac{1}{n-1} \sum_{i=1}^{n} (x_i - \bar{x})^2}$$

where the value of s is the phase jitter value.

26. A speech immune tone detection system as claimed in claim 24 wherein phase jitter is determined by first determining mean phase deviation (dm) in accordance with the equation:

$$dm = \frac{1}{n} \sum_{i=1}^{n} |x_i - \bar{x}|$$

and then relating phase jitter to mean phase deviation in accordance with the equation:

$$\sigma_m = \sqrt{\frac{\pi}{2}}\, dm$$

where the value of $\sigma_m$ is the phase jitter value.

27. A speech immune tone detection system as claimed in claim 24 wherein said digital logic means includes:
  (A) a transition detector connected to the output of said squaring means for producing a pulse each time said preselected directional transition of said incoming signal occurs;
  (B) cycle counting means for counting pulses produced by said transition detector;
  (C) a clock for producing clock pulses;
  (D) interval counting means connected to said clock for counting clock pulses between the production of pulses by said transition detector, said clock pulses counts defining the values of $x_i$;
  (E) a memory connected to said counting means; and,
  (F) a controller connected to said transition detector, said cycle counting means, said interval counting means and said memory for:
    (1) transferring said clock pulse counts that define the values of $x_i$ to said memory and, then, resetting said interval counting means each time a pulse is produced by said transition detector;
    (2) summing said clock pulse counts that define the values $x_i$ and are stored in memory each time said cycle counting means counts up to a value equal to said predetermined number of cycles (n);
    (3) determining said phase deviation between each of said measured time between transitions and said mean time between transitions ($x_i - \bar{x}$); and,
    (4) determining said phase jitter of said incoming signal based on said phase deviation information and said predetermined number of cycles.

28. A speech immune tone detection system as claimed in claim 27 wherein phase jitter is determined in accordance with the standard deviation estimate equation:

$$s = \sqrt{\frac{1}{n-1} \sum_{i=1}^{n} (x_i - \bar{x})^2}$$

where the value of s is the phase jitter value.

29. A speech immune tone detection system as claimed in claim 27 wherein phase jitter is determined by first determining mean phase deviation (dm) in accordance with the equation:

$$dm = \frac{1}{n} \sum_{i=1}^{n} |x_i - \bar{x}|$$

and then relating phase jitter to mean phase deviation in accordance with the equation:

$$\sigma_m = \sqrt{\frac{\pi}{2}}\, dm$$

where the value of $\sigma_m$ is the phase jitter value.

30. A signal-to-noise ratio measuring system comprising:
  (A) a squaring circuit for receiving and squaring the wave shape of the signal whose signal-to-noise ratio is to be measured;
  (B) electronic circuit means coupled to said squaring means for measuring the signal-to-noise ratio of said incoming signal by: (i) determining the phase difference between each cycle of the squared incoming signal and the average frequency of the squared incoming signal over a predetermined number of preceeding cycles of the incoming signal; (i) combining said phase difference information and said predetermined number of cycles information to determine the phase jitter of said incoming signal; and, (iii) converting said phase jitter into signal-to-noise ratio form, said electronic circuit means including:
    (1) phase determining means connected to the output of said squaring means for determining the phase difference between each cycle of the signal whose signal-to-noise ratio is to be determined and the average frequency of the preceeding cycles of said signal and producing a related phase difference output signal;
    (2) cycle counting means for counting at a rate related to the frequency of said incoming signal;
    (3) signal detecting means connected to the output of said squaring means for detecting the presence of the signal whose signal-to-noise ratio is to be determined, said signal detecting means connected to said cycle counting means for inhibiting the operation of said cycle counting means until said signal detecting means detects the presence of the signal whose signal-to-noise ratio is to be measured; and,
    (4) digital integrating means connected to said phase determining means for integrating the phase difference output signal of said phase determining means and to said cycle counting means for being reset when said cycle counting means reaches a predetermined level; and,
  (C) display means connected to the output of said digital integrating means for displaying the output of said digital integrating means just prior to said digital integrating means being reset by said cycle counting means, said display representing the signal-to-noise ratio of the signal whose signal-to-noise ratio is to measured.

31. The signal-to-noise ratio measuring system claimed in claim 30 wherein said display means is connected to said cycle counting means such that said display means is enabled to read the output of said digital integrating means when said cycle counting reaches a predetermined level and wherein the output of said cycle counting means is also connected through a delay to said digital integrating means to reset said digital integrating means after the output of said digital integrating means has been read by said display means.

32. A signal-to-noise ratio measuring system as claimed in claim 31 wherein said phase determining means is a phase locked loop.

33. A signal-to-noise ratio measuring system as claimed in claim 32 wherein said cycle counting means is a cycle counter having a clock input connected to receive a signal having a frequency related to the frequency of said incoming signal.

34. A signal-to-noise ratio measuring system as claimed in claim 33 wherein said digital integrating means includes a clock and a digital integrator having clock, enable and reset inputs, the output of said clock being coupled to the clock input of said digital integrator, the phase difference output of said phase locked loop connected to the enable input of said digital integrator such that said digital integrator is enabled based on the phase difference information produced by said phase locked loop and the reset input of said digital integrator connected to the output of said cycle counter via said delay.

35. The signal-to-signal-to-noise ratio measuring system comprising:
(A) a squaring means for receiving and squaring the wave shape of the signal whose signal-to-noise ratio is to be measured;
(B) electronic circuit means coupled to said squaring means for measuring the phase jitter of said incoming signal by: (i) determining the phase difference between each cycle of the squared incoming signal and the average frequency of the squared incoming signal over a predetermined number of preceeding cycles of the incoming signal; (ii) combining said phase difference information and said predetermined number of cycles information to determine the phase jitter of said incoming signal; and, (iii) converting said phase jitter into signal-to-noise ratio form, said electronic circuit means including a digital logic means for:
(1) measuring the time between preselected directional transitions of said squared incoming signal ($x_i$) over said predetermined number of cycles (n) of said incoming signal;
(2) determining the mean time between preselected directional transitions of said squared incoming signal ($\bar{x}$);
(3) determining the phase difference between each of said measured time between transitions and said mean time between transitions ($x_i - \bar{x}$);
(4) determining the phase jitter of said incoming signal based on said phase difference information and said predetermined number of cycles; and,
(5) converting said phase jitter data into said signal-to-noise ratio data; and, (C) display means coupled to said electronic circuit means for displaying said signal-to-noise ratio data.

36. A signal-to-noise measuring system as claimed in claim 35 wherein phase jitter is determined in accordance with the standard deviation estimate equation:

$$s = \sqrt{\frac{1}{n-1} \sum_{i=1}^{n} (x_i - \bar{x})^2}$$

where the value of s is the phase jitter value; and wherein said phase jitter value is converted into signal-to-noise ratio (SNR) form in accordance with the equation:

$$SNR = \frac{1}{\sqrt{2} \, SIN\left(\frac{s}{\bar{x}} 2\pi\right)}$$

37. A signal-to-noise ratio measuring system as claimed in claim 35 wherein phase jitter is determined by first determining mean phase deviation (dm) in accordance with the equation:

$$dm = \frac{1}{n} \sum_{i=1}^{n} |x_i - \bar{x}|$$

and then relating phase jitter to mean phase deviation in accordance with the equation:

$$\sigma_m = \sqrt{\frac{\pi}{2}} \, dm$$

where the value of $\sigma_m$ is the phase jitter value; and wherein said phase jitter value is converted into signal-to-noise ratio (SNR) form in accordance with the equation:

$$SNR = \frac{\bar{x}}{\sigma_m 2 \sqrt{2} \, \pi}$$

38. A signal-to-noise ratio measuring system as claimed in claim 35 wherein said digital logic means includes:
(A) a transition detector connected to the output of said squaring means for producing a pulse each time said preselected directional transition of said incoming signal occurs;
(B) cycle counting means for counting pulses produced by said transition detector;
(C) a clock for producing clock pulses;
(D) interval counting means connected to said clock for counting clock pulses between the production of pulses by said transition detector, said clock pulses defining the values of $x_i$;
(E) a memory connected to said counting means; and,
(F) a controller connected to said transition detector, said cycle counting means, said interval counting means and said memory for:
(1) transferring clock pulse counts that define the value of $x_i$ to said memory and, then, resetting said interval counting means each time a pulse is produced by said transition detector;

(2) summing said clock pulse counts that define the values of $x_i$ and are stored in memory each time said cycle counting means counts up to a value equal to said predetermined number of cycles (n);

(3) determining said phase deviation between each of said measured time between transitions and said mean time between transitions ($x_i - \bar{x}$);

(4) determining said phase jitter of said incoming signal based on said phase deviation information and said predetermined number of cycles; and, (5) converting said phase jitter data into signal-to-noise ratio form.

39. A signal-to-noise ratio measuring system as claimed in claim 38 wherein phase jitter is determined in accordance with the standard deviation estimate equation:

$$s = \sqrt{\frac{1}{n-1} \sum_{i=1}^{n} (x_i - \bar{x})^2}$$

where the value of s is the phase jitter value; and wherein said phase jitter value is converted into signal-to-noise ratio (SNR) form in accordance with the equation:

$$SNR = \frac{1}{\sqrt{2} \, \text{SIN}\left(\frac{s}{\bar{x}} 2\pi\right)}$$

40. A signal-to-noise ratio measuring system as claimed in claim 38 wherein phase jitter is determined by first determining mean phase deviation (dm) in accordance with the equation:

$$dm = \frac{1}{n} \sum_{i=1}^{n} |x_i - \bar{x}|$$

and then relating phase jitter to mean phase deviation in accordance with the equation:

$$\sigma_m = \sqrt{\frac{\pi}{2}} \, dm$$

where the value of $\sigma_m$ is the phase jitter value; and, wherein said phase jitter value is converted into signal-to-noise ratio (SNR) form in accordance with the equation:

$$SNR = \frac{\bar{x}}{\sigma_m 2 \sqrt{2} \, \pi}$$

* * * * *